United States Patent
Keeth

(10) Patent No.: US 8,130,527 B2
(45) Date of Patent: Mar. 6, 2012

(54) STACKED DEVICE IDENTIFICATION ASSIGNMENT

(75) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 738 days.

(21) Appl. No.: 12/209,048

(22) Filed: Sep. 11, 2008

(65) Prior Publication Data

US 2010/0064114 A1    Mar. 11, 2010

(51) Int. Cl.
*G11C 5/02* (2006.01)
(52) U.S. Cl. .............. 365/51; 365/52; 365/63
(58) Field of Classification Search .......... 365/51, 365/52, 63
See application file for complete search history.

(56) References Cited

U.S. PATENT DOCUMENTS

| | | |
|---|---|---|
| 6,523,070 B1 | 2/2003 | Stapleton et al. |
| 6,830,941 B1 | 12/2004 | Lee et al. |
| 7,062,569 B2 | 6/2006 | Poulter et al. |
| 7,111,149 B2 | 9/2006 | Eilert |
| 7,760,533 B2 * | 7/2010 | Alzheimer ............ 365/51 |
| 2005/0010725 A1 | 1/2005 | Eilert |
| 2006/0160271 A1 | 7/2006 | Fox et al. |
| 2006/0273455 A1 | 12/2006 | Williams et al. |
| 2007/0067554 A1 | 3/2007 | Hinrichs |
| 2007/0152194 A1 | 7/2007 | Natekar et al. |
| 2008/0159539 A1 | 7/2008 | Huang et al. |
| 2009/0267224 A1 * | 10/2009 | Landry et al. ............ 257/723 |

FOREIGN PATENT DOCUMENTS

| | | |
|---|---|---|
| EP | 1509923 | 8/2007 |
| KR | 6088907 | 8/2006 |
| WO | WO-2003102957 A1 | 12/2003 |
| WO | WO-2010030799 A1 | 3/2010 |

OTHER PUBLICATIONS

"International Application Serial No. PCT/US2009/056538, Search Report mailed Feb. 1, 2010", 3 pgs.
"International Application Serial No. PCT/US2009/056538, Written Opinion mailed Feb. 1, 2010", 4 pgs.
Schaper, L, et al., "Integrated System Development for 3-D VLSI", *Proceedings. 57th Electronic Components and Technology Conference*, 2007. ECTC '07., (May 29, 2007-Jun. 1, 2007), 853-857.
Wilson, Matt, et al., "2D, 3D and Beyond: Inspecting Stacked Die in MCPs", *Advanced Packaging Online Article*, http://ap.pennnet.com/display_article/292476/36/ARCHI/none/INDUS/1/2D,-3D-and-Beyond:-Inspecting-Stacked-Die-in-MCPs/, (May, 2007), 1-4.

* cited by examiner

*Primary Examiner* — Huan Hoang
(74) *Attorney, Agent, or Firm* — Schwegman, Lundberg & Woessner, P.A.

(57) ABSTRACT

Some embodiments include apparatus and methods having dice arranged in a stack. The dice include at least a first die and a second die, and a connection coupled to the dice. The connection may be configured to transfer control information to the first die during an assignment of a first identification to the first die and to transfer the control information from the first die to the second die during an assignment of a second identification to the second die.

40 Claims, 12 Drawing Sheets

STACKED DEVICE IDENTIFICATION ASSIGNMENT

BACKGROUND

Computers and other electronic products, e.g., televisions, digital cameras, and cellular phones, often use memory devices to store data and other information. Some memory devices may have multiple semiconductor dice arranged in a stack. Each of these dice may have its own identification (ID) to allow appropriate communication. Assigning an ID to a die in some conventional techniques may include performing either wire bond programming or fuse programming. Some stacked dice may not have wire bonds, and therefore wire bond programming may be unsuitable. Fuse programming may involve individually assigning an ID to the die before it is arranged in the stack with other dice. Fuse programming may also use some kind of record keeping to track the die and its assigned ID. Record keeping, however, may create additional work.

DETAILED DESCRIPTION

Figure 1:
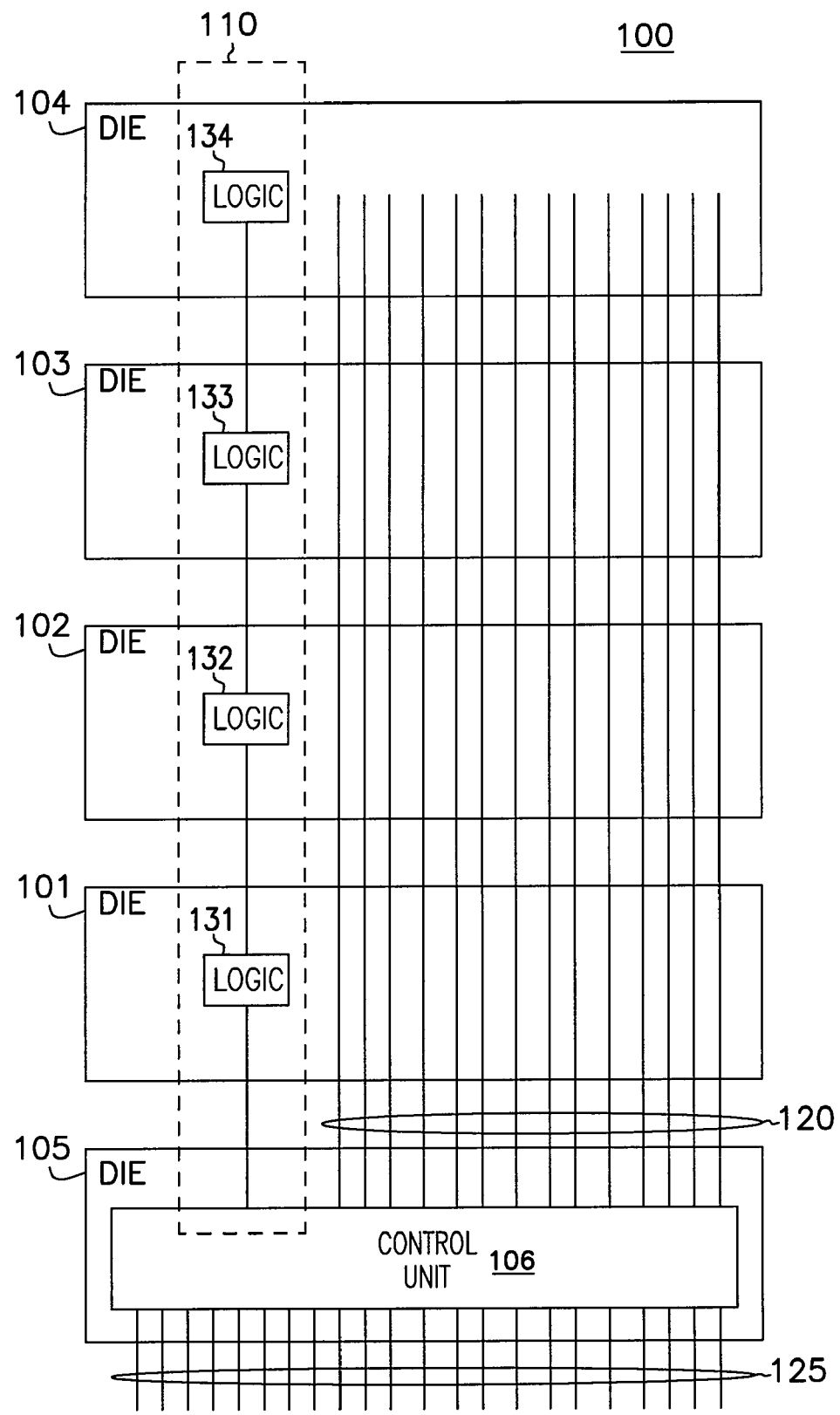
FIG. 1 is a block diagram of an apparatus including dice and connections according to an embodiment of the invention.

FIG. 1 is a block diagram of an apparatus 100 including dice 101, 102, 103, 104, and 105, and connections 110 and 120, according to an embodiment of the invention. Apparatus 100 may include or be included in a memory device, a processor, a computer, a television, a digital camera, a cellular phone, or another electronic device or system.

Each of dice 101, 102, 103, 104, and 105 may include a semiconductor-based material (e.g., silicon) where electrical circuit components are located. Connections 110 and 120 may allow communication to and from dice 101, 102, 103, 104, and 105. Apparatus 100 may include a control unit 106 located at one of these dice, e.g., at die 105, to control operations in these dice or exchange information (e.g., signals) between apparatus 100 and other external devices (e.g., a memory controller device or a processor) through connections 125. Dice 101, 102, 103, 104, and 105 may be physically arranged in a stack and connections 110, 120, and 125 may correspond to conductive paths that run through these dice.

Each of dice 101, 102, 103, 104, and 105 may have a different identification (ID) to distinguish one die from another and allow appropriate communication to and from each of these dice. Dice 101, 102, 103, 104, and 105 may initially (e.g., when the dice are manufactured) have no ID or may each have an ID that may be replaceable. Apparatus 100 may assign IDs (e.g., assign new IDs or replace old IDs) to some or all of these dice during an ID assignment. The ID assignment may be performed during an initialization of apparatus 100.

Apparatus 100 may assign different IDs to dice 101, 102, 103, and 104. Each ID assigned to each die may include multiple bits. For example, apparatus 100 may use bits 00, 10 and 11 and assign them to dice 101, 102, 103, and 104, respectively. Thus, after the ID assignment in this example, dice 101, 102, 103, and 104 may have IDs 00, 01, 10 and 11, respectively. Then, in this example, apparatus 100 may communicate with each die based on IDs 00, 01, 10 and 11. Two bits are used here for each ID as an example; however, apparatus 100 may use any number of bits for each ID.

Connections 120 may transfer different IDs at different times to dice 101, 102, 103, and 104 during an ID assignment. Apparatus 100 may use a single connection (e.g., a single physical line) or multiple connections (e.g., multiple physical lines) among connections 120 to transfer each ID. For example, apparatus 100 may transfer multiple bits of each ID on one of connections 120 in a serial fashion (transfer one bit after another). In another example, apparatus 100 may transfer multiple bits of each ID on multiple connections among connections 120 in a parallel fashion (transfer the bits concurrently).

Connection 110 may transfer control information to dice 101, 102, 103, and 104 during an ID assignment. As shown in FIG. 1, apparatus 100 may include logic components 131, 132, 133, and 134 located at dice 101, 102, 103, and 104, respectively. Each of these logic components may form a portion of connection 110 to transfer the control information from die to die during the ID assignment. As described above, connections 120 may transfer IDs that are to be assigned to dice 101, 102, 103, and 104 during an ID assignment. The control information transferred on connection 110, separately from connections 120, may allow each of dice 101, 102, 103, and 104 to receive a particular ID from connections 120.

Logic components 131, 132, 133, and 134 may operate to sequentially transfer the control information from control unit 106 to dice 101, 102, 103, and 104 such that each of these dice may receive the control information in an ordered manner. When a particular die (e.g., die 101) receives the control information, apparatus 100 may allow the particular die to receive the ID (e.g., bits 00) that is transferred on connections 120. Then, the particular die may store the ID in its memory elements (e.g., registers) as its ID. After a die (e.g., die 101) is assigned an ID, connection 110 may transfer the control information to a next die (e.g., 102) so that apparatus 100 may assign a different ID (e.g., bits 01) to the next die.

Besides using connections 110 and 120 to the transfer control information and IDs during an ID assignment, apparatus 100 may use connections 110 and 120 (e.g., use connections 120 as a bus) to transfer other information, e.g., address, data, and other control information, in other operations, such as a write operation to store data into dice 101, 102, 103, and 104 or a read operation to read stored data from these dice. Apparatus 100 may include a device described below with reference to FIG. 2 through FIG. 12.

Figure 2:
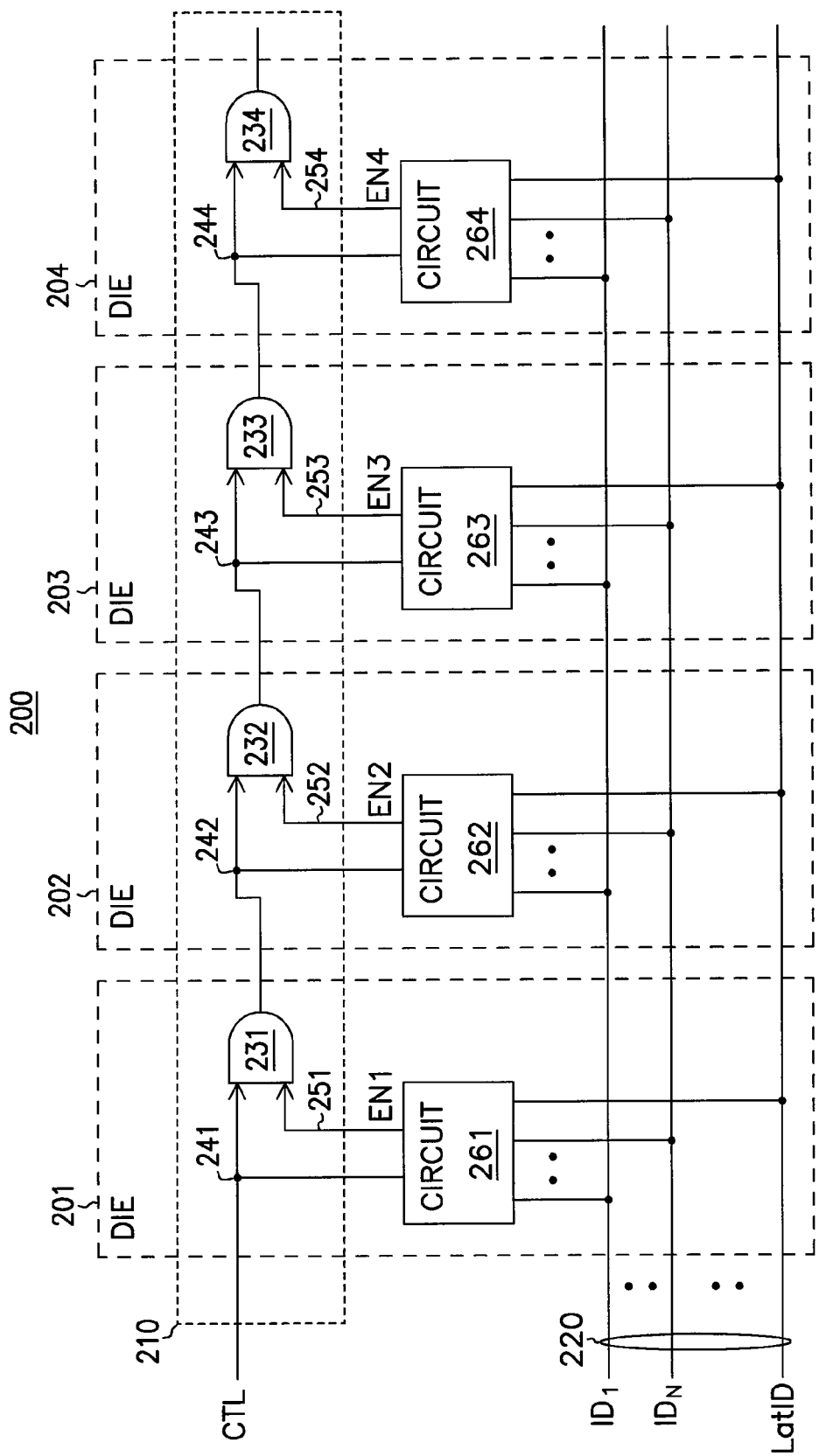
FIG. 2 is a schematic diagram showing a device having a connection with logic AND gates according to an embodiment of the invention.

FIG. 2 is a schematic diagram showing a device 200 having a connection 210 with logic AND gates 231, 232, 233, and 234 according to an embodiment of the invention. Device 200 may also include dice 201, 202, 203, and 204 and connections 220. Connection 210 of FIG. 2 may correspond to connection 110 of FIG. 1. Connections 220 of FIG. 2 may correspond to at least a portion of connections 120 of FIG. 1. FIG. 2 shows device 200 with four dice as an example. The number of dice in device 200 may vary.

In FIG. 2, device 200 may use connection 210 to transfer control information CTL and connections 220 to transfer IDs during an assignment of IDs to dice 201, 202, 203, and 204. Control information CTL may include a signal, which may represent a bit. Control information CTL may include only a single bit. The single bit may have a value such as logic 1 or logic 0.

ID bits $ID_1$ through $ID_N$ in FIG. 2 may include signals representing multiple bits of each ID (where "N" is the number of bits in each ID) that device 200 may assign to a different one of dice 201, 202, 203, and 204. For example, when an ID to be assigned has two bits and the two bits have a binary value of 01, then bit $ID_1$ may have binary 0 value and bit $ID_N$ may have a binary 1 value. After an ID is assigned to a die, device 200 may change the values of ID bits $ID_1$ through $ID_N$ on connections 220 so that a different ID may be assigned to a different die. For example, after a first ID is assigned to die 201, device 200 may change the values of ID bits $ID_1$ through $ID_N$ three times to have three different additional IDs to assign to dice 202, 203, and 204.

Device 200 may use a signal LatID on connection 220 to allow each of dice 201, 202, 203, and 204 to load a corresponding ID from connection 220 and store it in its memory elements. Device 200 may also use the LatID signal to change the value of an ID that has been assigned to a die among dice 201, 202, 203, and 204 to a different value, so that each of the dice 201, 202, 203, and 204 may have a unique ID. For example, device 200 may assert a first signal level (e.g., high) to load an ID with a first value (e.g., 00) to a corresponding die (e.g., die 201). Then, device 200 may change first signal level of the LatID signal to a second signal level (e.g., low) to change the value of the ID to a new value (e.g., 01) before it loads the ID with the new value to a next die.

FIG. 2 shows ID bits $ID_1$ through $ID_N$ being transferred on multiple connections of connections 220 in a parallel fashion as an example. Device 200 may use a single connection (e.g., a single physical line) of connections 220 to transfer ID bits $ID_1$ through $ID_N$ in a serial fashion.

Connection 210 may sequentially transfer control information CTL to nodes 241, 242, 243, and 244 of corresponding dice 201, 202, 203, and 204. Device 200 may initially (e.g., before a corresponding die is assigned an ID) set each of nodes 241, 242, 243, and 244 to a value that is different from the value of control information CTL. For example, each of nodes 241, 242, 243, and 244 may initially have a logic 0 value and control information CTL may have a logic 1 value. An indication that control information CTL has been transferred to (has arrived at) a particular node (one of nodes 241, 242, 243, and 244) occurs when the value of that particular node changes from one value (e.g., the initial value of logic 0) to another value that matches the value (e.g., logic 1) of control information CTL. In contrast, an indication that control information CTL has not been transferred to (has not arrived at) a particular node among nodes 241, 242, 243, and 244 occurs when the value of the node remain unchanged at a value (e.g., the initial value of logic 0) that is different from the value (e.g., logic 1) of control information CTL.

Dice 201, 202, 203, and 204 may include circuits 261, 262, 263, and 264, respectively. As shown in FIG. 2, each of circuits 261, 262, 263, and 264 may couple to some of connections 220 where bits $ID_1$ through $ID_N$ and other information may be transferred. Circuits 261, 262, 263, and 264 may set enable information EN1, EN2, EN3 and EN4 at nodes 251, 252, 253, and 254 to an initial value (e.g., a logic value 0) so that nodes 241, 242, 243, and 244 may also be set an initial value (e.g., a logic value 0). After the initial value at nodes 241, 242, 243, and 244 are set, each of circuits 261, 262, 263, and 264 may sense the value of the information at these nodes to determine whether or not control information CTL has been transferred to the corresponding die.

When control information CTL is transferred to node 241, 242, 243, or 244 of a corresponding die (one of dice 201, 202, 203, and 204), device 200 may assign an ID to that corresponding die. For example, when control information CTL is transferred to node 241, 242, 243, or 244 of a corresponding die, the circuit (one of circuits 261, 262, 263, and 264) of the corresponding die may set an indication (e.g., flags or logic elements in the circuit) to a particular value to allow the corresponding circuit to receive ID bits $ID_1$ through $ID_N$ from connections 220. Then, the corresponding circuit may store ID bits $ID_1$ through $ID_N$ as the ID for the die, so that the die may identify itself or be identified by another die or by other devices external to device 200. The corresponding circuit may store ID bits $ID_1$ through $ID_N$ in its memory elements such as registers. In FIG. 2, after a die is assigned an ID (e.g., after the ID is stored), circuit 261, 262, 263, or 264 corresponding to that die may ignore other IDs on connections 220 that are intended for other dice. For example, after a die is assigned an ID, circuit 261, 262, 263, or 264 corresponding to that die may set the same indication or another indication (e.g., other flags or other logic elements in the circuit) to a different value to allow the die to ignore other IDs on connections 220 that are intended for other dice.

When control information CTL is not transferred to node 241, 242, 243, or 244 of a corresponding die, device 200 may not assign an ID to that corresponding die. For example, when control information CTL is not transferred to node 241, 242, 243, or 244 of a corresponding die, the circuit (one of circuits 261, 262, 263, and 264) of the corresponding die may set an indication (e.g., flags or logic elements in the circuit) to a particular value to prevent the corresponding circuit of the corresponding die from receiving ID bits $ID_1$ through $ID_N$ from connections 220. The corresponding circuit may ignore ID bits $ID_1$ through $ID_N$ from connections 220 until the control information CTL is transferred to that die.

Circuits 261, 262, 263, and 264 may provide enable information EN1, EN2, EN3 and EN4, respectively. Each of circuits 261, 262, 263, and 264 may include circuit elements (e.g., logic elements) to provide the corresponding enable information EN1, EN2, EN3 or EN4 with a logic value such as logic 0 or logic 1. For example, each of circuits 261, 262, 263, and 264 may provide enable information EN1, EN2, EN3 or EN4 with logic 0 value when control information CTL has not transferred to the circuit. Circuits 261, 262, 263, and 264 may use enable information EN1, EN2, EN3 and EN4, respectively, to allow logic AND gates 231, 232, 233, and 234 to transfer information from one die to the next die at an appropriate time. For example, after circuit 261 receives control information CTL and stores ID bits $ID_1$ through $ID_N$ that are assigned to die 201, circuit 261 may change the value of the enable information EN1 from one value (e.g., logic 0) to another value (e.g., logic 1) so that an output node (which is coupled to node 432) of logic AND gates 231 has control information CTL to allow it to transfer control information CTL from node 241 of die 201 to node 242 of die 202. After circuit 262 receives control information CTL and stores ID bits $ID_1$ through $ID_N$ that are assigned to die 202, circuit 261 may change the value of the enable information EN2 from one value (e.g., logic 0) to another value (e.g., logic 1) so that an output node (which is coupled to node 243) of logic AND gates 232 has control information CTL to allow it to transfer control information CTL from node 242 of die 202 to node 243 of die 203.

Each of logic AND gates 231, 232, 233, and 234 may include input nodes responsive to a logical combination of control information CTL and a corresponding one of enable information EN1, EN2, EN3 and EN4 at nodes 251, 252, 253, and 254, respectively, to produce a result at an output node of the corresponding logic AND gate. For example, logic AND gate 231 may include input nodes coupled to nodes 241 and 251 to logically combine the value of control information CTL at node 241 with the value of enable information EN1 at node 251 to produce a result at the output node of logic AND gate 231, which is coupled to node 242. The value of the result (e.g., logic 0 or logic 1) at the output node (node 242) of logic AND gate 231 indicates whether or not control information CTL has been transferred from die 201 to die 202. For example, if control information CTL has a logic 1 value and enable information EN1 has a logic 1 value (which indicates that an ID has been stored in die 201), then the value of the result at node 242 is a logic 1 value, which matches the value of control information CTL. Thus, in this example, control information CTL has been transferred from die 201 to die 202. In another example, if control information has a logic 1 value and enable information EN1 has a logic 0 value (which indicates that an ID has not received by die 201 or has not been stored in die 201), then the value of the result at node 242 is a logic 0 value, which is different from the value of control information CTL. Thus, in this example, control information CTL has not been transferred from die 201 to die 202.

Logic AND gates 232, 233, and 234 may operate in a manner similar to the operation of logic AND gate 231, described above. For example, logic AND gate 232 may include input nodes coupled to nodes 242 and 252 to logically combine the value of control information CTL at node 242 with the value of enable information EN2 at node 252 to produce a result at the output node of logic AND gate 232, which is coupled to node 243. The value of the result (e.g., logic 0 or logic 1) at the output node (node 243) of logic AND gate 232 indicates whether or not control information CTL has been transferred from die 202 to die 203.

Logic AND gate 233 may include input nodes coupled to nodes 243 and 253 to logically combine the value of control information CTL at node 243 with the value of enable information EN3 at node 253 to produce a result at the output node of logic AND gate 233, which is coupled to node 244. The value of the result (e.g., logic 0 or logic 1) at the output node (node 243) of logic AND gate 233 indicates whether or not control information CTL has been transferred from die 203 to die 204.

Logic AND gate 234 may include input nodes coupled to nodes 244 and 254 to logically combine the value of control information CTL at node 244 with the value of enable information EN4 at node 254 to produce a result at the output node of logic AND gate 234, which is coupled to node 245. The value of the result (e.g., logic 0 or logic 1) at the output node (node 245) of logic AND gate 234 indicates whether or not control information CTL has been transferred from die 204 to an additional die coupled to die 204 if device 200 includes the additional die, which may be similar or identical to one of die 201, 202, 203, and 204. If device 200 does not include an additional die coupled to node 245, then circuit 254 may ignore changing the value of enable information EN4, or die 204 may omit logic AND gate 234 and enable information EN4.

FIG. 2 shows circuits 261, 262, 263, and 264 being located at dice 201, 202, 203, and 204 as an example. Some or all of circuits 261, 262, 263, and 264 may be located outside dice 201, 202, 203, and 204, such as located at another die of device 200 (e.g., a die similar or identical to die 105 of FIG. 1).

Device 200 may include a memory device with components such as memory cells, decode circuits, control circuits, and input/output circuits, which are not shown in FIG. 2 to help focus on the embodiments described herein. Die 201, 202, 203, and 204 of device 200 may be arranged in a stack, e.g., the stack shown in FIG. 3, FIG. 5, or FIG. 7.

Figure 3:
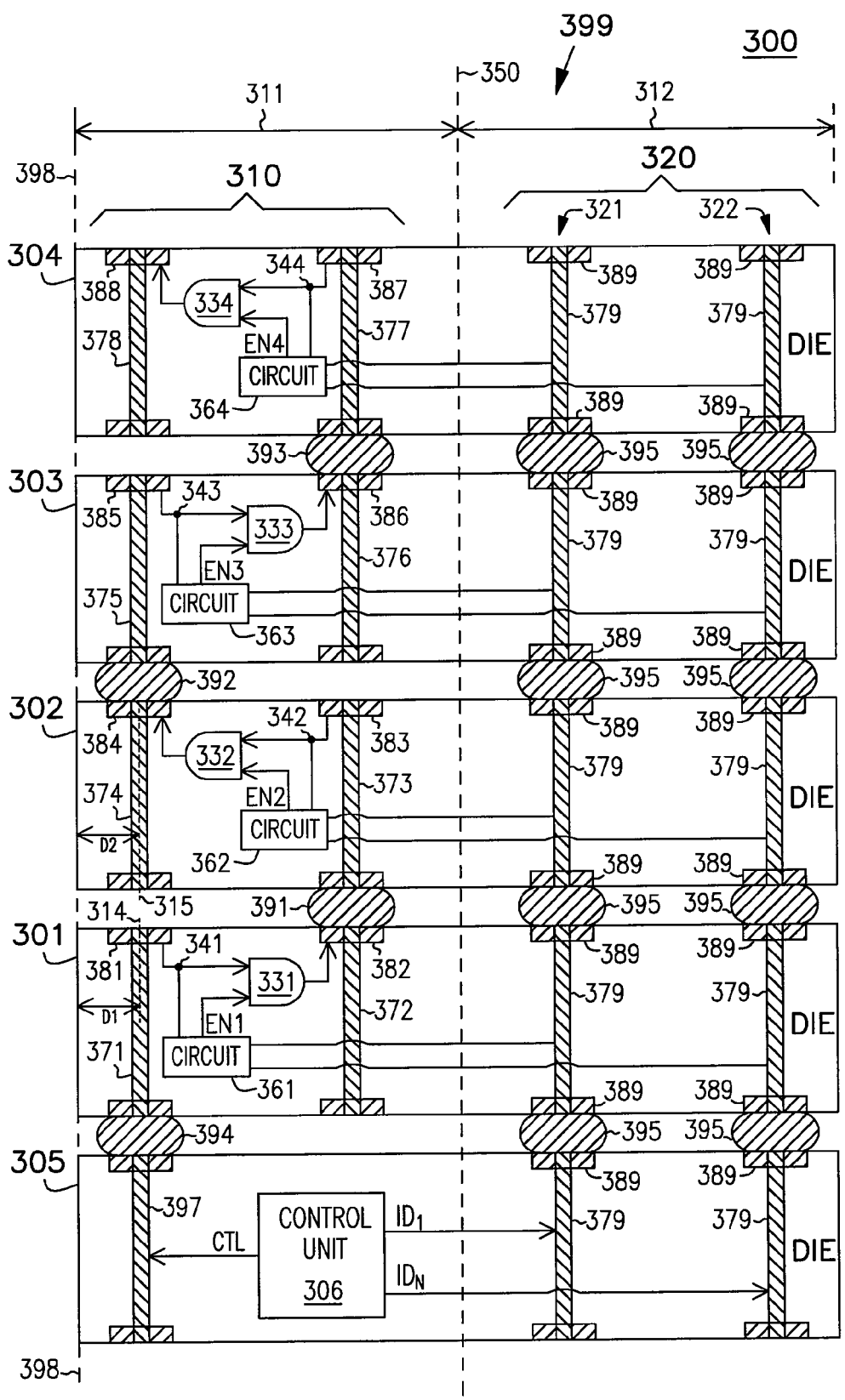
FIG. 3 shows a partial cross-section of a device including a stack of dice with a connection according to an embodiment of the invention.

FIG. 3 shows a partial cross-section of a device 300 including a stack 399 of dice 301, 302, 303, 304, and 305 with a connection 310 according to an embodiment of the invention. At least a portion of device 300, e.g., die 301, 302, 303, and 304, may be represented by a schematic diagram similar or identical to the schematic diagram of device 200 of FIG. 2.

As shown in FIG. 3, connection 310 of device 300 may include at least logic AND gates 331, 332, 333, and 334, nodes 341, 342, 343, and 344, vias (sometimes called through holes) 371, 372, 373, 374, 375, 376, 377, 378, and 397, and contacts 381, 382, 383, 384, 385, 386, 387, and 388. Connection 310 may also include conductive joints 391, 392, 393, and 394 located outside dice 301, 302, 303, and 304 and coupled to the corresponding contacts and vias as shown in FIG. 3.

Device 300 may also include connections 320 having vias 379, contacts 389, and conductive joints 395, forming two separate conductive paths 321 and 322 that extend through the dice to transfer IDs such as ID bits $ID_1$ through $ID_N$. Besides transferring IDs, conductive paths 321 and 322 may form a bus to transfer information such as address, data, and other information. FIG. 3 shows connections 320 having two conductive paths 321 and 322 as an example; however, connections 320 may include more than two conductive paths that are similar or identical to conductive paths 321 and 322.

Vias 371 through 379, contacts 381 through 389, and conductive joints 391 through 395 include conductive material. As shown in FIG. 3, at least a portion of each of contacts 381 through 388 may contact a corresponding via to allow electrical conductivity between each of contacts 381 through 388 and the corresponding via. For example, at least a portion of each of contacts 381, 383, 386, and 387 may contact vias 371, 373, 376, and 377, respectively, to allow control information CTL to be transferred to nodes 341, 342, 343, and 344 that are coupled to contacts 381, 383, 386, and 387 and vias 371, 373, 376, and 377. As shown in FIG. 3, via 374, 376, and 378 may not be electrically connected to via 371, 373, and 375 by a conductive joint, and via 372 may not be electrically connected to a via of die 205 by a conductive joint. Thus, device 300 may omit vias 372, 374, 376, and 378 in some cases.

Device 300 may also include circuits 361, 362, 363, and 364 to provide enable information EN1, EN2, EN3, and EN4 to allow logic AND gates 331, 332, 333, and 334 to sequentially transfer control information CTL to dice 301, 302, 303, and 304 at nodes 341, 342, 343, and 344, respectively. Nodes 341, 342, 343, and 344 may correspond to nodes 241, 242, 243, and 244, respectively, of FIG. 2. The operations of circuits 361, 362, 363, and 364 and logic AND gates 331, 332, 333, and 334 to transfer control information CTL during an assignment of IDs to dice 301, 302, 303, and 304 are similar to or identical to the operations of circuits 261, 262, 263, and 264 and logic AND gates 231, 232, 233, and 234 of FIG. 2.

In FIG. 3, device 300 may include circuit components such as memory cells, decode circuits, control circuits, and input/output circuits, which are not shown in FIG. 3 to help focus on the embodiments described herein. Device 300 may be formed using techniques known to those skilled in the art. For clarity, FIG. 3 shows some features in cross-section illustration and some other features in block diagram illustration. For example, FIG. 3 shows vias 371 through 379, contacts 381 through 389, and conductive joints 391, 392, 393, 394, and 395 in cross-section illustration, and circuits 361 through 364, logic AND gates 331 through 334, and control unit 306 in block diagram illustration. Some or all features shown in the drawings in this description may not have section line symbols (cross-hatch lines) when the features are shown in a cross section view.

Device 300 may include a control unit 306 to provide control information CTL and IDs during an assignment of IDs to die 301, 302, 303, and 304. Control information CTL and ID bits $ID_1$ through $ID_N$, however, may be provided by another component of device 300 or by a device external to device 300, such as a memory controller device or a processor. Device 300 may transfer control CTL and ID bits $ID_1$ through $ID_N$ to dice 301, 302, 303, and 304 in ways similar or identical to the ways used by apparatus 100 and device 200 described above with reference to FIG. 1 and FIG. 2. For example, in FIG. 3, during an assignment of an ID to die 301, control unit 306 may transfer control information CTL to contact 381, which is coupled to node 341 and to circuit 361 of die 301. Circuit 361 may sense the value of the information at node 341 and determine that control information CTL has been transferred to node 341. In response to control information CTL that has been transferred to node 341, circuit 361 may change a value of an indication (e.g., flags or logic elements in circuit 361) to a particular value to allow circuit 361 to receive ID bits $ID_1$ through $ID_N$ from connections 220 and store them in its memory elements (e.g., registers) as the ID for die 301. After ID bits $ID_1$ through $ID_N$ are stored, circuit 361 may change the value of enable information EN1 (e.g., change from logic 0 to logic 1) to enable logic AND gate 331 to transfer control information CTL from node 341 of die 301 to contact 382, which is coupled to conductive joint 391, via 373, contact 383, node 342, and circuit 362. Circuit 362 may sense the value of the information at node 342 and determine that control information CTL has been transferred to node 342. In response to control information CTL that has been transferred to node 342, circuit 362 may change a value of an indication (e.g., flags or logic elements in circuit 362) to a particular value to allow circuit 362 to may receive ID bits $ID_1$ through $ID_N$, which have values corresponding to an ID that is different from the ID assigned to die 301. Circuit 362 may store ID bits $ID_1$ through $ID_N$ as the ID for die 302. After ID bits $ID_1$ through $ID_N$ are stored, circuit 362 may change the value of enable information EN2 (e.g., change from logic 0 to logic 1) to enable logic AND gate 332 to transfer control information CTL from node 342 of die 302 to contact 384, which is coupled to conductive joint 392, via 375, contact 385, node 343, and circuit 363. Device 300 repeats the process at die 303 and 304 to transfer control information CTL and different values of ID bits $ID_1$ through $ID_N$ to allow assignment of IDs to die 303 and die 304.

FIG. 3 shows logic AND gates 331 and 333 facing the same direction with respect to an edge 398 of stack 399 (both gates face away from edge 398) to indicate that the physical structures (e.g., layouts) of logic AND gates 331 and 333 may have an identical (or substantially identical) orientation with respect to edge 398. FIG. 3 also shows logic AND gates 332 and 334 facing the same direction with respect to edge 398 to indicate that the physical structures (e.g., layouts) of logic AND gates 332 and 334 may have an identical (or substantially identical) orientation with respect to edge 398. As shown in FIG. 3, logic AND gates 331 and 332 may face opposite directions (180 degrees) with respect to edge 398. For example, the path from an input node (node coupled to node 341) of logic AND gate 331 to an output node (node coupled to contact 382) of logic AND gate 331 faces away from edge 398, whereas the path from an input node (node coupled to node 342) of logic AND gate 332 to an output node (node coupled to contact 384) of logic AND gate 332 faces toward edge 398. Thus, the physical structures of logic AND gates 331 and 332 may have different orientations with respect to edge 398.

As shown FIG. 3, vias 371 and 374 and contacts 381 and 384 may be aligned with respect to an edge 398 of stack 399 such that a distance D1 between a center 314 of contact 381 and edge 398 is equal (or substantially equal) to a distance D2 between a center 315 of contact 384 and edge 398.

FIG. 3 shows a center axis 350 that extends in a dimension perpendicular to the cross-section of stack 399 through dice 301, 302, 303, and 304. Center axis 350 divides the cross-section of stack 399 into two equal (or substantially equal) sides 311 and 312. As shown in FIG. 3, contacts 381 through 388 may be located on one side (e.g., side 311) of stack 399.

Figure 4:
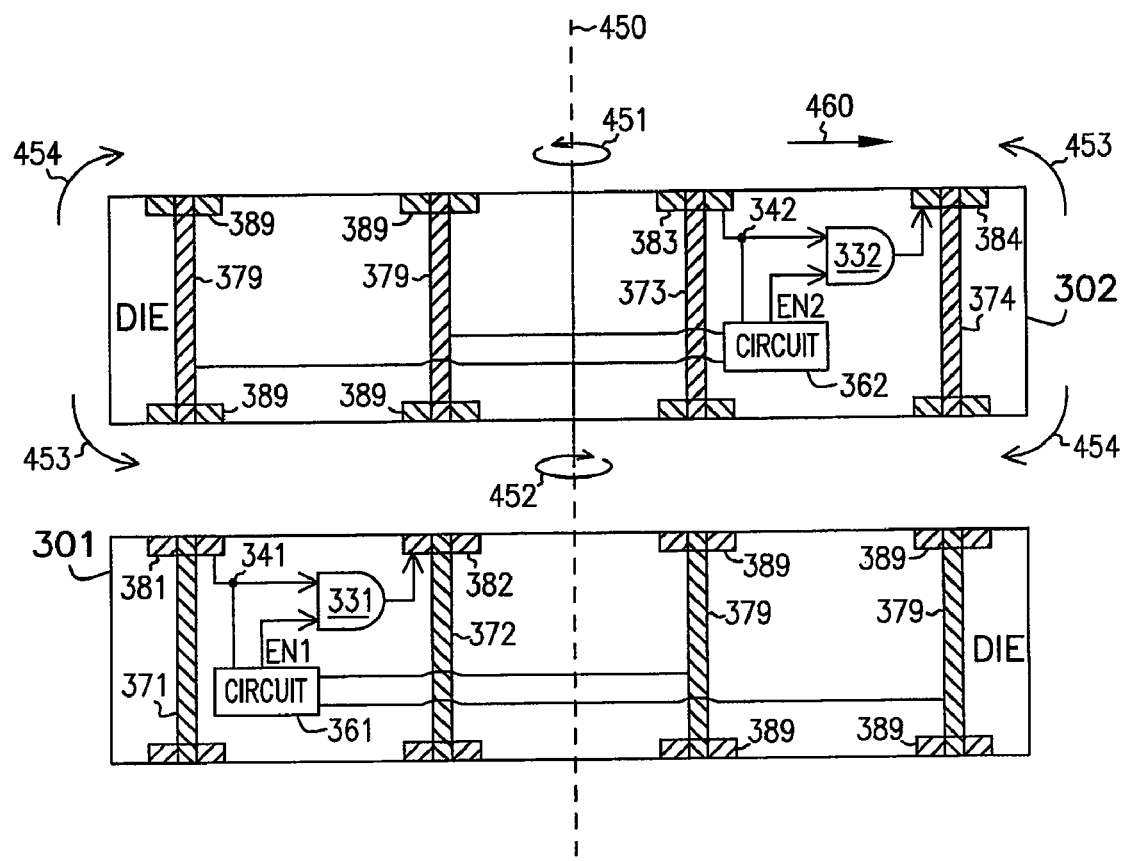
FIG. 4 shows a partial cross-section of some dice of FIG. 3 before they are arranged in a stack.

FIG. 4 shows a partial cross-section of die 301 and die 302 of FIG. 3 before they are arranged in stack 399 of FIG. 3. When die 301 and die 302 of FIG. 4 are arranged in stack 399 of FIG. 3, one of these dice, e.g., die 302, may be rotated 180 degrees about a center axis 450 in either rotating direction 451 or rotating direction 452, so that logic AND gates 331 and 332 may be coupled to each other to form a portion of connection 310 of stack 399 as shown in FIG. 3. In FIG. 4, instead of rotating die 302 in rotating direction 451 or 452, die 302 may be flipped 180 degrees from end to end in flipping direction 453 or flipping direction 454, so that logic AND gates 331 and 332 may be coupled to each other to form a portion of connection 310 of stack 399 as shown in FIG. 3.

As shown in FIG. 4, logic AND gates 331 and 332 may face the same direction 460. Thus, the physical structures of logic AND gates 331 and 332, before die 301 and 302 are arranged in a stack (e.g., stack 339 of FIG. 3), may have an identical (or substantially identical) orientation. In FIG. 4, since logic AND gates 331 and 332 may face the same direction 460 before they arranged in a stack, logic AND gates 331 and 332 may face opposite directions (e.g., 180 degrees from each other) after one of die 301 and 302 is either rotated or flipped when die 301 and 302 are arranged in the stack such as stack 399 of FIG. 3. Similarly, in FIG. 3, the physical structures of logic AND gates 333 and 334 before die 303 and 304 are arranged in stack 339 may have an identical (or substantially identical) orientation (similar to die 301 and 302 of FIG. 4), and may have different orientations after one of die 303 and 304 is rotated or flipped to be arranged in stack 339.

When dice 301, 302, 303, and 304 are arranged in stack 399 of FIG. 3, die 301 may be attached to a die holder and dice 302, 303, and 304, one after another, may be arranged in stack 399 with die 301. For example, die 302 (FIG. 4) may be either rotated or flipped before it is arranged in a stack with die 301. Then, die 303 may be arranged with dice 301 and 302 (as shown in FIG. 3) without rotating or flipping die 303 because die 303 may have an orientation that is identical (or substantially identical) to die 301 of FIG. 4. After dice 301, 302, and 303 are arranged in the stack, die 304 may be either rotated or flipped before it is arranged in stack 399 with dice 301, 302, and 303 (as shown in FIG. 3), because die 304 may have an orientation that is identical (or substantially identical) to that of die 302 of FIG. 4 before it is arranged in stack 399. Having identical or substantially identical orientation of logic components in dice (such as logic AND gates 331 and 332 in dice 301 and 302 of FIG. 4) before the dice are arranged in a stack (such as stack 399 of FIG. 3) may simplify manufacturing of the dice.

Figure 5:
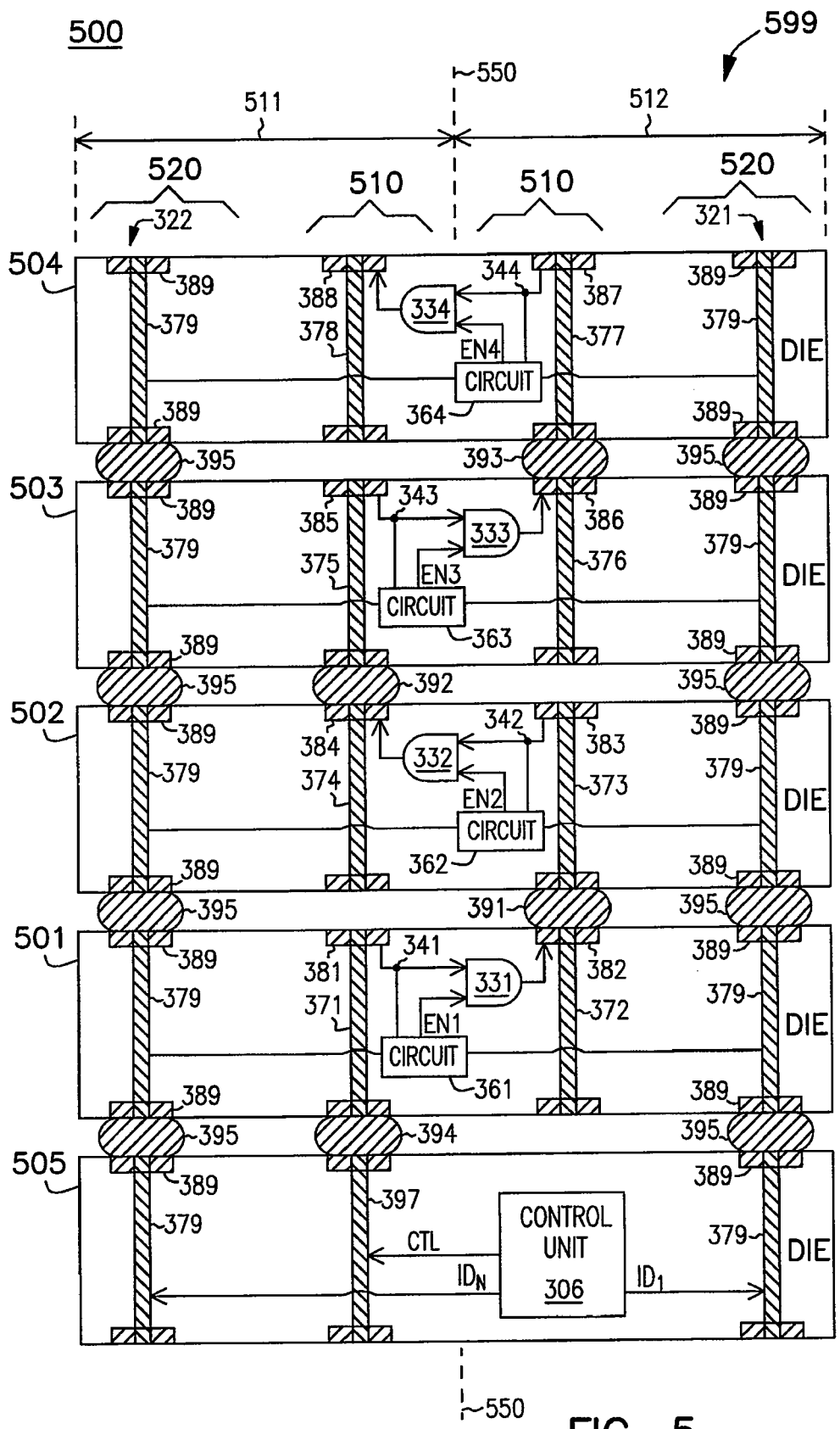
FIG. 5 shows a partial cross-section of a device including a stack of dice with a connection having components on both side of the stack according to an embodiment of the invention.

FIG. 5 shows a partial cross-section of a device 500 including a stack 599 of dice 501, 502, 503, 504, and 505 with a connection 510 having components on both sides 511 and 512 of stack 599, according to an embodiment of the invention. Device 500 may include components similar or identical to the components of device 300 of FIG. 3, with the exception of the locations of some components of connections 510 and 520 of FIG. 5. Thus, for simplicity, the components that are similar or identical in FIG. 3 and FIG. 5 are given the same reference label. Connections 510 and 520 of device 500 may transfer control information CTL and ID bits $ID_1$ through $ID_N$ in ways similar or identical to those of apparatus 100 of FIG. 1, device 200 of FIG. 2, or device 300 of FIG. 3.

As shown in FIG. 5, stack 599 has a center axis 550 that extends in a dimension perpendicular to the cross-section of stack 599, through dice 501, 502, 503, and 504. Center axis 550 divides the cross-section of stack 599 into two equal (or substantially equal) sides 511 and 512. In FIG. 3, contacts 381 through 388 may be located on one side (e.g., side 311) of stack 399. In FIG. 5, however, components of connection 510 are located on both sides 511 and 512. For example, contact 381 of die 501 is located on side 511, whereas contact 382 of die 501 is located on side 512. In another example, contact 383 of die 502 is located on side 512, whereas contact 384 of die 502 is located on side 511.

FIG. 5 shows an example where device 500 may transfer ID bits $ID_1$ through $ID_N$ on conductive paths (e.g., conductive paths 321 and 322) of connections 520 in which the conductive paths are located on both sides 511 and 512 of stack 599. Device 500, however, may transfer ID bits $ID_1$ through $ID_N$ on conductive paths that are on the same side (e.g., on side 512) of stack 599. For example, FIG. 5 shows side 512 with only one conductive path 321 for clarity. However, side 512 may include multiple conductive paths similar or identical to conductive path 321, such that device 500 may transfer ID bits $ID_1$ through $ID_N$ on the multiple paths on side 512 of stack 599. FIG. 5 shows an example where each of circuits 361, 362, 363, and 364 may be coupled to multiple conductive paths (e.g., conductive paths 321 and 322) of connections 520 to receive ID bits $ID_1$ through $ID_N$, in which the conductive paths are located on both sides 511 and 512 of stack 599. Each of circuits 361, 362, 363, and 364, however, may be coupled to conductive paths that are on the same side (e.g., on side 512) of stack 599 to receive ID bits $ID_1$ through $ID_N$.

Figure 6:
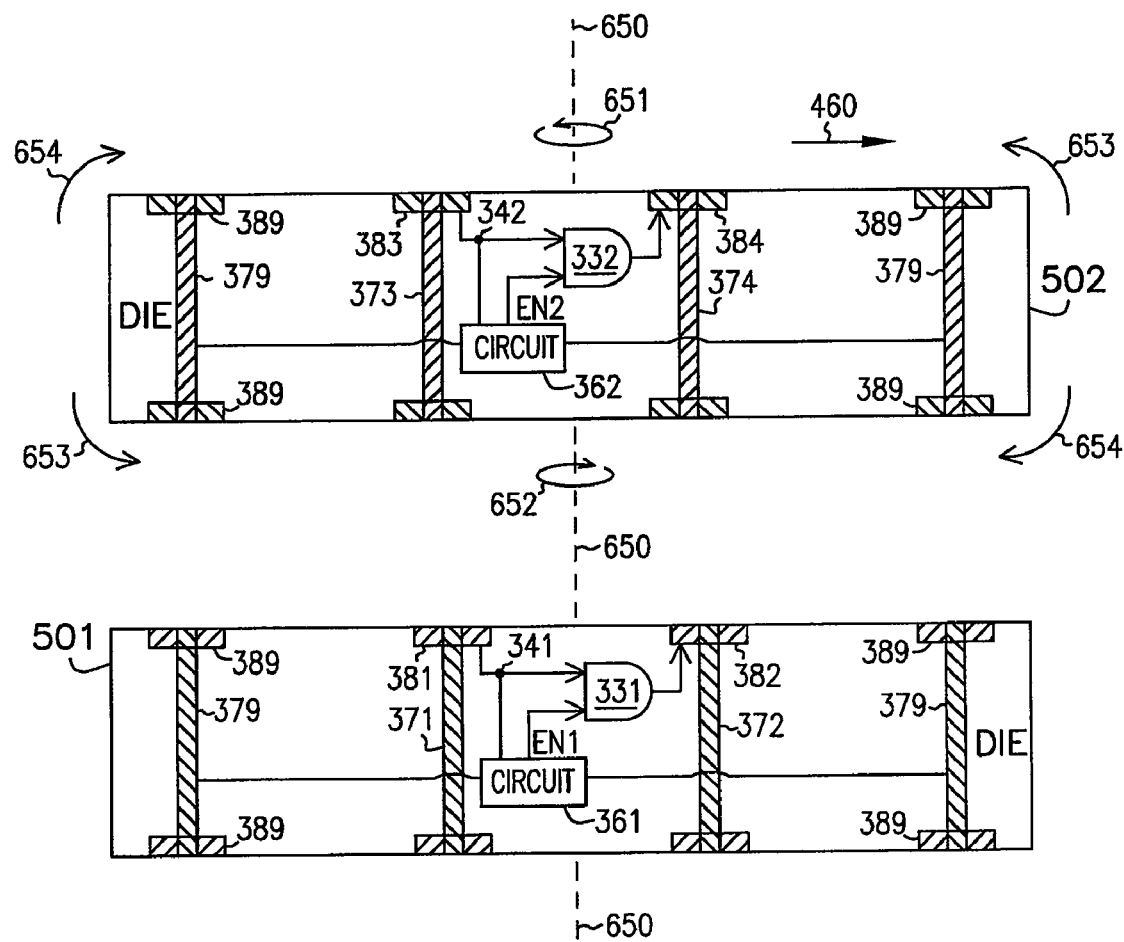
FIG. 6 shows a partial cross-section of some dice of FIG. 5 before they are arranged in a stack.

FIG. 6 shows a partial cross-section of die 501 and die 502 of FIG. 5 before they are arranged in stack 599 of FIG. 5. When die 501 and die 502 of FIG. 6 are arranged in stack 599 of FIG. 5, one of these dice, e.g., die 502, may be rotated 180 degrees about a center axis 650 in either rotating direction 651 or rotating direction 652, so that logic AND gates 331 and 332 may be coupled to each other to form a portion of connection 510 of stack 599 as shown in FIG. 5. In FIG. 6, instead of rotating die 502 in rotating direction 651 or 652, die 502 may be flipped 180 degrees from end to end in flipping direction 653 or flipping direction 654, so that logic AND gates 331 and 332 may be coupled to each other to form a portion of connection 510 of stack 599 as shown in FIG. 5.

Figure 7:
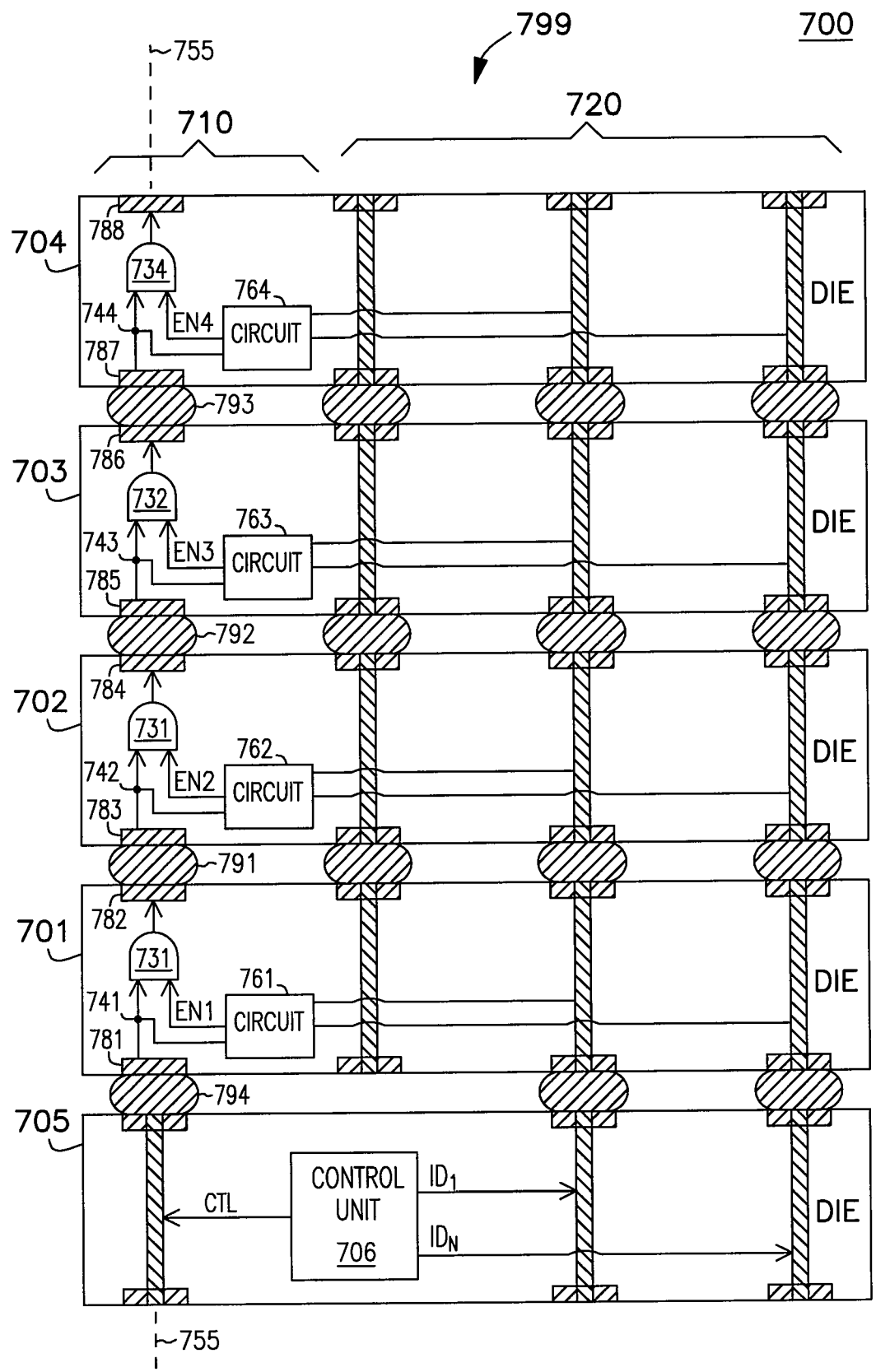
FIG. 7 shows a partial cross-section of a device including a stack of dice with a connection without vias coupled to some contacts of the connection according to an embodiment of the invention.

FIG. 7 shows a partial cross-section of device 700 including a stack 799 of dice 701, 702, 703, 704, and 705 with a connection 710, and without vias coupled to some contacts of connection 710, according to an embodiment of the invention. As shown in FIG. 7, connection 710 may include at least logic AND gates 731, 732, 733, and 734, nodes 741, 742, 743, and 744, and contacts 781, 782, 783, 784, 785, 786, 787, and 788. Connection 710 may also include conductive joints 791, 792, 793, and 794 coupled to the corresponding contacts among contacts 781 through 788, as shown in FIG. 7. Device 700 may also include connections 720 to transfer IDs, such as ID bits $ID_1$ through $ID_N$, during an assignment of IDs to dice 701, 702, 703, and 704. Connections 720 may form a bus to transfer information besides $ID_1$ through $ID_N$, such as address, data, and other information. Device 700 may also include circuits 761, 762, 763, and 764 to provide enable information EN1, EN2, EN3, and EN4 to allow logic AND gates 731, 732, 733, and 734 to sequentially transfer control information CTL to dice 701, 702, 703, and 704 at nodes 741, 742, 743, and 744, respectively. Nodes 741, 742, 743, and 744 may correspond to nodes 241, 242, 243, and 244, respectively, of FIG. 2, or to nodes 341, 342, 343, and 344, respectively, of FIG. 3 and FIG. 5.

The operations of circuits 761, 762, 763, and 764 and logic AND gates 731, 732, 733, and 734 to transfer control information CTL during an assignment of IDs to dice 701, 702, 703, and 704 are similar or identical to the operations of circuits 261, 262, 263, and 264 and logic AND gates 231, 232, 233, and 234 of FIG. 2, or the operations of circuits 361, 362, 363, and 364 and logic AND gates 331, 332, 333, and 334 of FIG. 3 and FIG. 5.

Device 700 may include a control unit 706 to provide control information CTL and IDs during an assignment of IDs to dice 701, 702, 703, and 704. Control information CTL and ID bits $ID_1$ through $ID_N$, however, may be provided by another component of device 700 or by a device external to device 700, such as a memory controller device or a processor. Device 700 may transfer control CTL and ID bits $ID_1$ through $ID_N$ to dice 701, 702, 703, and 704 in ways similar or identical to the ways used by apparatus 100 and devices 200, 300, and 500 described above with reference to FIG. 1 through FIG. 6.

As shown in FIG. 7, dice 701, 702, 703, and 704 may omit vias (e.g., vias similar to vias 371, 373, 376 and 377 of FIG. 3) coupled to contacts 781 through 788. Thus, contacts 381 through 388 may be aligned along a line 755, which is perpendicular to the cross-section of stack 599, as shown in FIG. 7. Since contacts 381 through 388 may be aligned as shown in FIG. 7, space in each of dice 701, 702, 703, and 704 may be saved.

Device 700 may include circuit components such as memory cells, decode circuits, control circuits, and input/output circuits, which are not shown in FIG. 7 to help focus on the embodiments described herein. Device 700 may be formed using techniques known to those skilled in the art.

Figure 8:
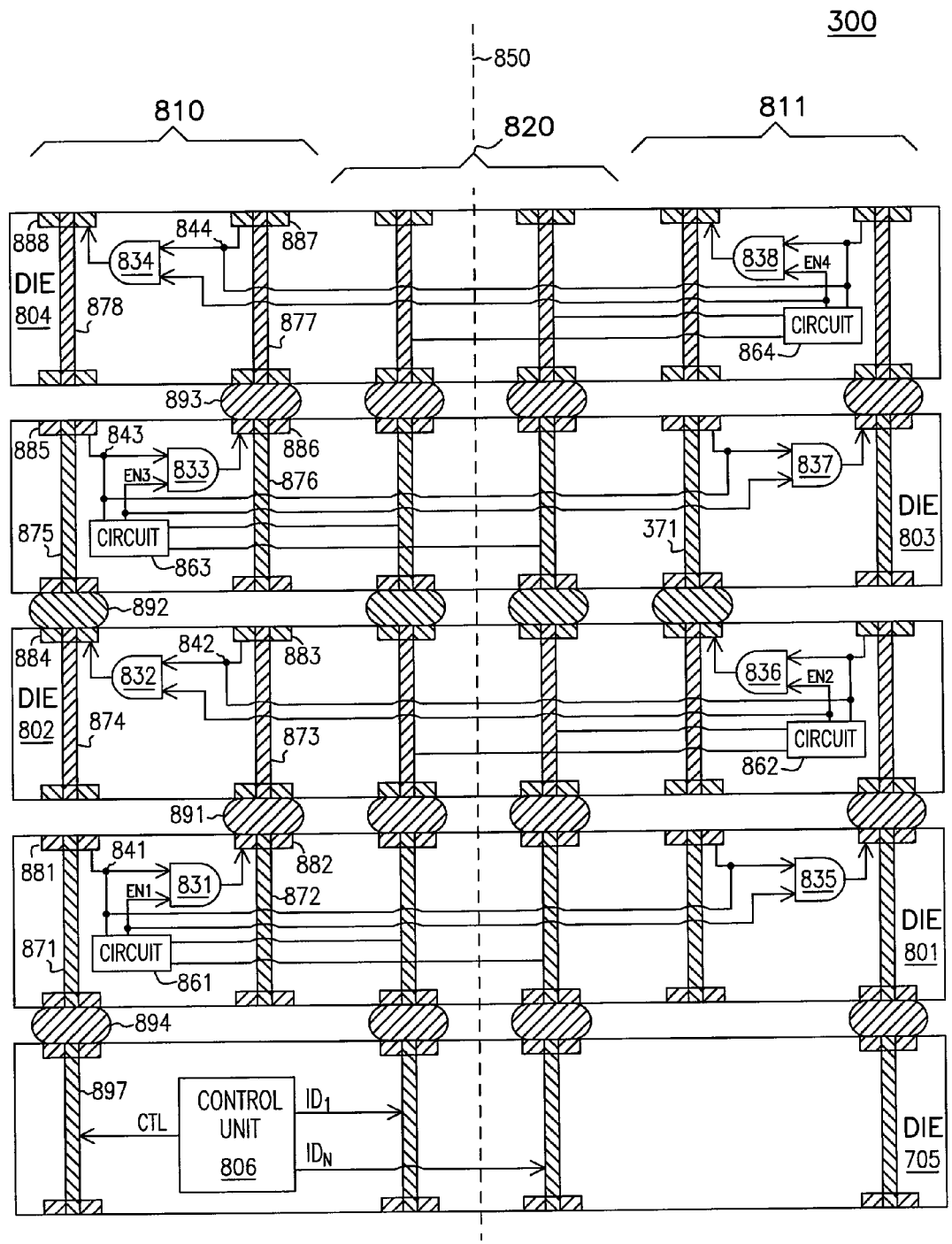
FIG. 8 shows a partial cross-section of a device including a stack of dice with a connection having a symmetrical pattern according to an embodiment of the invention.

FIG. 8 shows a partial cross-section of a device 800 including a stack of dice 801, 802, 803, and 804 with a connection having a symmetrical pattern according to an embodiment of the invention. Device 800 may include components similar to device 300 of FIG. 3 except that device 800 may include two connections 810 and 811 that may be arranged in a symmetrical pattern relative to a center axis 850.

Device 800 may use connection 810 during an ID assignment of dice 801, 802, 803, and 804 of stack 899 in ways similar to or identical to that of device 300 using connection 310 during an ID assignment of dice 301, 302, 303, and 304 of FIG. 3. Connection 810 of device 800 may include logic AND gates 831, 832, 833, and 834, nodes 841, 842, 843, and 844, vias 871, 872, 873, 874, 875, 876, 877, 878, and 897, and contacts 881, 882, 883, 884, 885, 886, 887, and 888. Connection 810 may also include conductive joints 891, 892, 893, and 894 coupled to the corresponding contacts and vias as shown in FIG. 8.

Device 800 may also include circuits 861, 862, 863, and 864 to provide enable information EN1, EN2, EN3, and EN4 to allow logic AND gates 831, 832, 833, and 834 to sequentially transfer control information CTL, provided by a control unit 806, to dice 801, 802, 803, and 804 at nodes 841, 842, 843, and 844, respectively. Device 800 may use connections 820 to transfer IDs, such as ID bits $ID_1$ through $ID_N$, during an ID assignment of dice 801, 802, 803, and 804. Device 800 may use connections 820 in ways similar to or identical to that of device 300 using connection 320 during an ID assignment of dice 301, 302, 303, and 304 of FIG. 3.

The operations of circuits 861, 862, 863, and 864 and logic AND gates 831, 832, 833, and 834 to transfer control information CTL during an ID assignment of dice 801, 802, 803, and 804 are similar to or identical to the operations of circuits 261, 262, 263, and 264 and logic AND gates 231, 232, 233, and 234 of FIG. 2, or to the operations of circuits 361, 362, 363, and 364 and logic AND gates 331, 332, 333, and 334 of FIG. 3.

As shown in FIG. 8, connection 811 may include components that are similar to those of connection 810. For example, connection 811 may include logic AND gates 835, 836, 837, and 838 coupled to other components to form at least a portion of connection 811 in ways similar to logic AND gates 831, 832, 833, and 834 coupled to other components to form at least a portion of connection 810. Although device 800 may include connection 811, it may not use this connection. For example, device 800 may use only connection 810 during an ID assignment of dice 801, 802, 803, and 804 and leave connection 811 unused.

Figure 9:
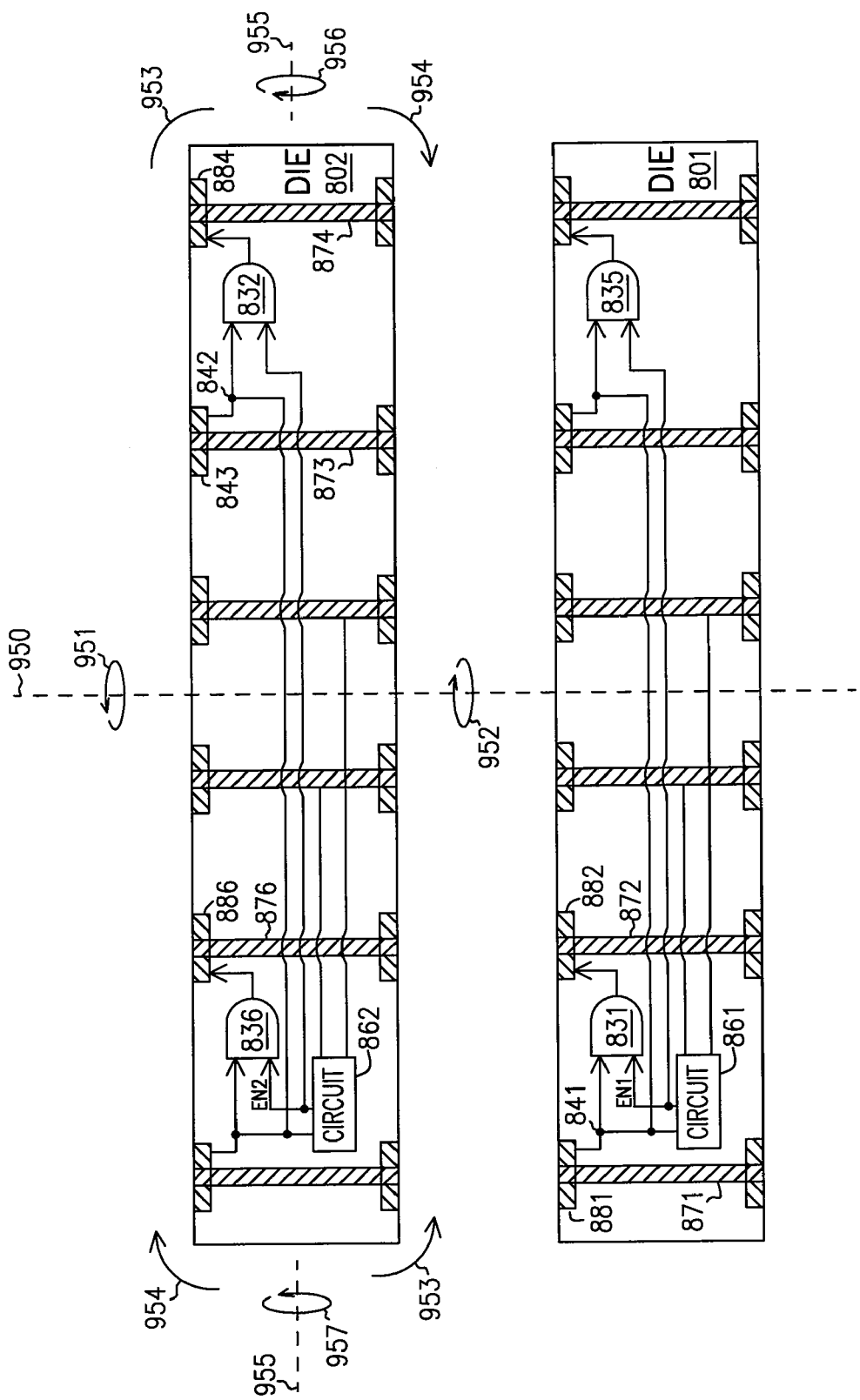
FIG. 9 shows a partial cross-section of some dice of FIG. 8 before they are arranged in a stack.

FIG. 9 shows a partial cross-section of die 801 and die 802 of FIG. 8 before they are arranged in stack 899 of FIG. 8. When die 801 and die 802 of FIG. 9 are arranged in stack 899 of FIG. 8, one of these dice, e.g., die 802, may be rotated 180 degrees about a center axis 950 in either rotating direction 951 or rotating direction 952, so that logic AND gate 831 of die 801 and logic AND gate 832 of die 802 may be coupled to each other to form a portion of connection 810 of stack 899 as shown in FIG. 8. In FIG. 9, instead of rotating die 802 in rotating direction 951 or 952, die 802 may be flipped and then rotated, or rotated and then flipped. For example, die 802 may be flipped 180 degrees from end to end in flipping direction 953 or flipping direction 954, and then die 802 may be rotated 180 degrees about axis 955 in either rotating direction 956 or rotating direction 957, so that logic AND gates 831 and 832 may be coupled to each other to form a portion of connection 810 of stack 899 as shown in FIG. 8. In another example, die 802 may be rotated 180 degrees about axis 955 in either rotating direction 956 or rotating direction 957, and then flipped 180 degrees from end to end in flipping direction 953 or flipping direction 954, so that logic AND gates 831 and 832 may be coupled to each other to form a portion of connection 810 of stack 899 as shown in FIG. 8. Other dice, such as die 804, may be rotated, flipped and then rotated, or rotated and then flipped in ways similar to that of die 802 when they are arranged in stack 899 of FIG. 8.

As shown in FIG. 9, dice 810 and 802 may include components that have a symmetrical pattern. For example, die 801 may include logic AND gates 831 and 835 and circuitry 861 that are arranged in a pattern similar to the pattern of logic AND gates 836 and 832 and circuitry 862 of die 802. The symmetrical pattern may simplify manufacturing of the dice.

Figure 10:
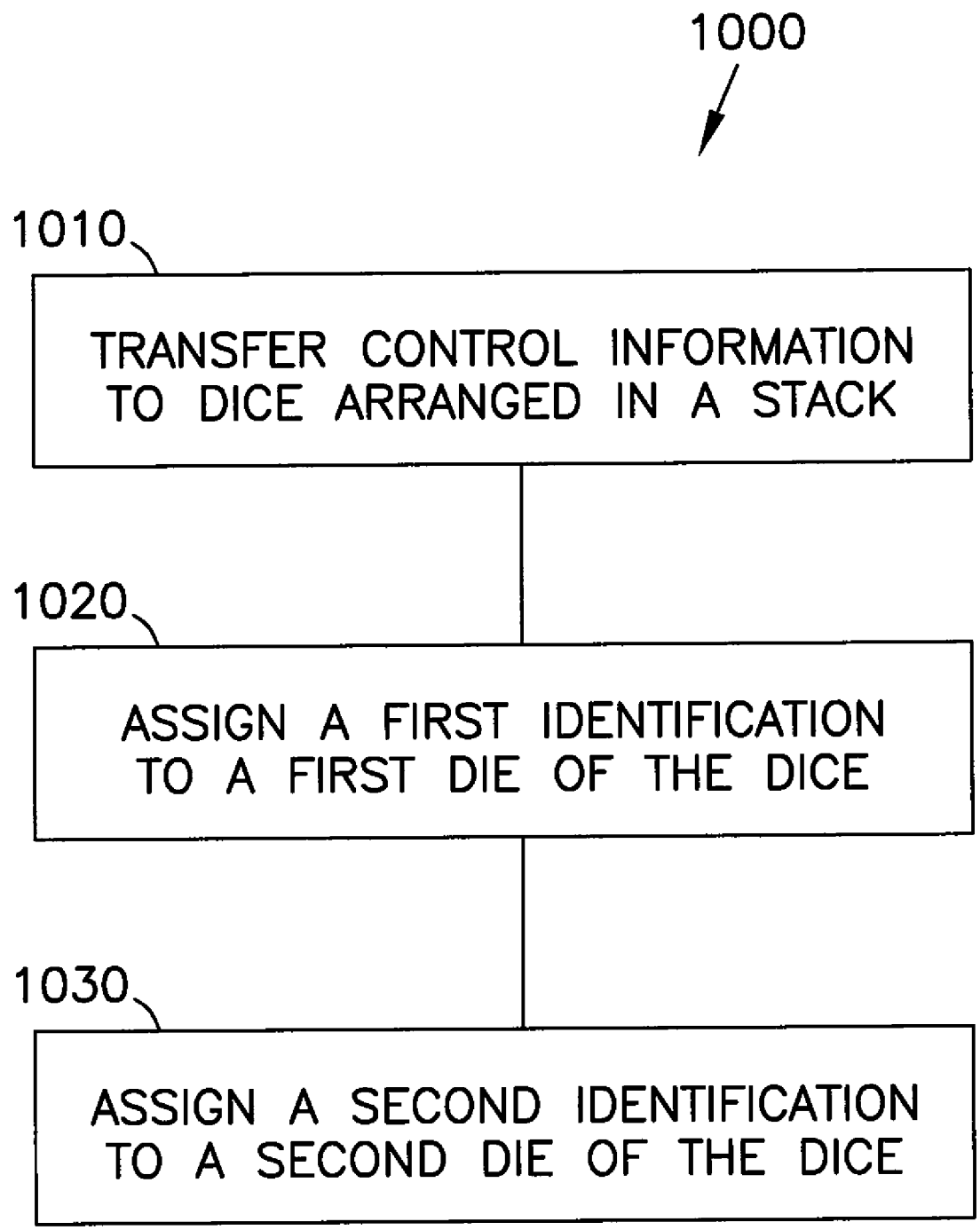
FIG. 10 is a flowchart showing a method of assigning IDs to dice in a stack according to an embodiment of the invention.

FIG. 10 is flowchart showing a method 1000 of assigning IDs to dice in a stack according to an embodiment of the invention. Method 1000 may be used in apparatus and devices similar or identical to apparatus 100 and devices, 200, 300, 500, 700, and 800 described above with reference to FIG. 1 through FIG. 9. Thus, the components of apparatus and devices used in method 1000 may include the components of apparatus 100 and devices, 200, 300, 500, 700, and 800 described above with reference to FIG. 1 through FIG. 9.

Activity 1010 of method 1000 may include transferring control information to dice arranged in a stack. The dice may include at least a first die and a second die. Activity 1010 may transfer the control information to the first die before activity 1010 transfers the control information to the second die. Activity 1020 may include assigning a first identification to the first die when the control information is transferred to the first die. Activity 1030 may include assigning a second identification to the second die in response to the control information being transferred to the second die. Method 1000 may include other activities similar or identical to the activities of transferring control information and IDs as described above with reference to FIG. 1 through FIG. 9.

Figure 11:
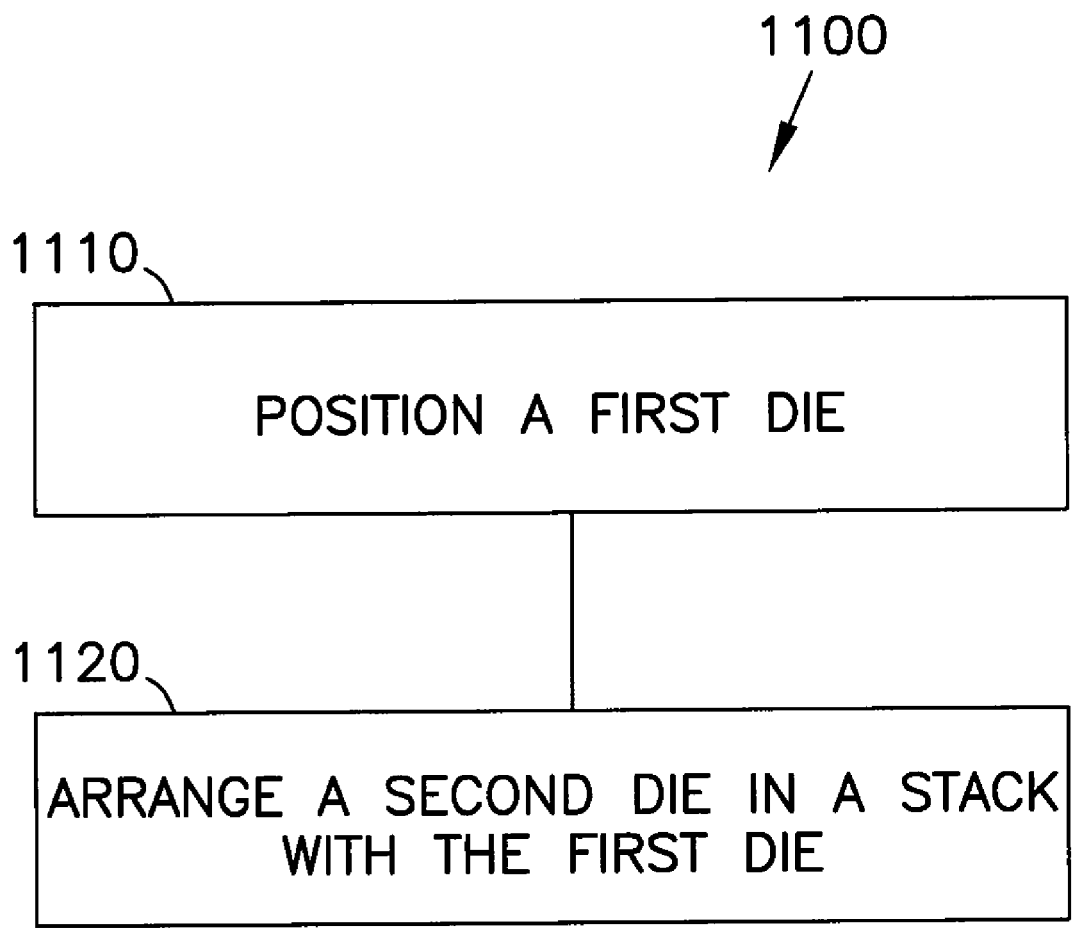
FIG. 11 is a flowchart showing a method of arranging dice in a stack according to an embodiment of the invention.

FIG. 11 is flowchart showing a method 1100 of arranging dice in a stack according to an embodiment of the invention. Method 1100 may be used in apparatus and devices similar or identical to apparatus 100 and devices, 200, 300, 500, 700, and 800 described above with reference to FIG. 1 through FIG. 9. Thus, the components of apparatus and devices used in method 1100 may include the components of apparatus 100 and devices, 200, 300, 500, 700, and 800 described above with reference to FIG. 1 through FIG. 9.

Activity 1110 of method 1100 may include positioning a first die. Positioning the first die may include attaching the first die to a die holder. Activity 1120 may include arranging a second die in a stack with the first die. Each of the first die and the second die may include a portion of a connection, which may be used to transfer control information to the first die and the second die during an assignment of a first identification to the first die and assignment of a second identification to the second die. Method 1100 may include other activities similar or identical to the activities of arranging dice in a stack (e.g., flipping and/or rotating a die) as described above with reference to FIG. 1 through FIG. 9.

Figure 12:
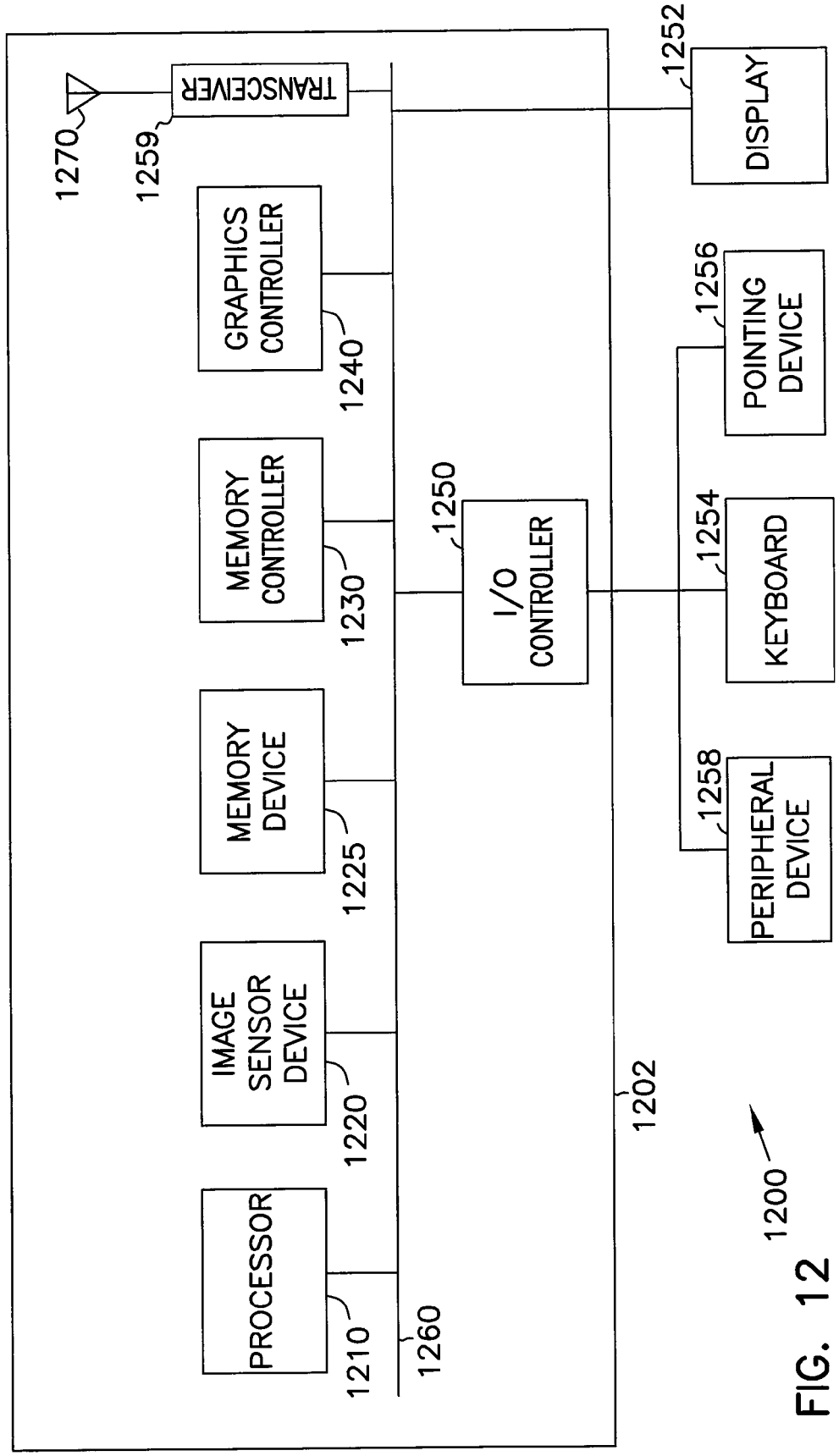
FIG. 12 shows a system according to an embodiment of the invention.

FIG. 12 shows a system 1200 according to an embodiment of the invention. System 1200 may include a processor 1210, memory device 1225, an image sensor device 1220, a memory controller 1230, a graphics controller 1240, an input and output (I/O) controller 1250, a display 1252, a keyboard 1254, a pointing device 1256, a peripheral device 1258, and a system transceiver 1259. System 1200 may also include a bus 1260 to transfer information among the components of system 1200 and provide power to at least some of these components, a circuit board 1202 where some of the components of system may be attached, and an antenna 1270 to wirelessly transmit and receive information to and from system 1200. System transceiver 1259 may operate to transfer information from one or more of the components of system 1200 (e.g., at least one of processor 1210 and memory device 1225) to antenna 1270. System transceiver 1259 may also operate to transfer information received at antenna 1270 to at least one of the processor 1210 and at least one of memory device 1225. The information received at antenna 1270 may be transmitted to system 1200 by a source external to system 1200.

Processor 1210 may include a general-purpose processor or an application specific integrated circuit (ASIC). Processor 1210 may include a single core processor or a multiple-core processor. Processor 1210 may execute one or more programming commands to process information. The information may include digital output information provided by other components of system 1200, such as by image sensor device 1220 or memory device 1225.

Memory device 1225 may include a volatile memory device, a non-volatile memory device, or a combination of both. For example, memory device 1225 may include a dynamic random access memory (DRAM) device, a static random access memory (SRAM) device, a flash memory device, phase change memory device, or a combination of these memory devices. Memory device 1225 may include one or more of the various embodiments described herein, such as apparatus 120, devices 220, 300, 500, 700, and 800, described above with reference to FIG. 1 through FIG. 9.

Image sensor device 1220 may include a complementary metal-oxide-semiconductor (CMOS) image sensor having a CMOS pixel array or charge-coupled device (CCD) image sensor having a CCD pixel array.

Display 1252 may include an analog display or a digital display. Display 1252 may receive information from other components. For example, display 1252 may receive information that is processed by one or more of image sensor device 1220, memory device 1225, graphics controller 1240, and processor 1210 to display information such as text or images.

The illustrations of apparatus (e.g., apparatus 120, devices 220, 300, 500, 700, and 800) and systems (e.g., system 1200) are intended to provide a general understanding of the structure of various embodiments and are not intended to provide a complete description of all the components and features of apparatus and systems that might make use of the structures described herein.

Any of the components described above can be implemented in a number of ways, including simulation via software. Thus, apparatus (e.g., apparatus 120, devices 220, 300, 500, 700, and 800) and systems (e.g., system 1200) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., apparatus 120, devices 220, 300, 500, 700, and 800) and systems (e.g., system 1200), and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to operate or simulate the operation of various potential embodiments.

The apparatus and systems of various embodiments may include or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, hand-held computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

One or more embodiments described herein include apparatus and methods having dice arranged in a stack. The dice include at least a first die and a second die. The stack may include a connection coupled to the dice. The connection may be configured to transfer control information to the first die during an assignment of a first identification to the first die and to transfer the control information from the first die to the second die during an assignment of a second identification to second die. Other embodiments including additional apparatus and methods are described above with reference to FIG. 1 through FIG. 12.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. An apparatus comprising:
   dice arranged in a stack, the dice including at least a first die and a second die; and
   a connection coupled to the dice and configured to transfer control information to the first die during an assignment of a first identification to the first die and to transfer the control information from the first die to the second die during an assignment of a second identification to the second die, wherein the connection includes a contact, a first portion coupling the contact to the first die, and a second portion coupling the first die to the second die, the contact configured to receive at least one bit of the control information, the first portion of the connection configured to transfer the at least one bit of the control information from the contact to the first die, and the second portion of the portion configured to transfer the at least one bit of the control information from the first die to the second die.

2. The apparatus of claim 1, wherein the stack includes a conductive joint coupled to the first die and the second die and located outside the first die and the second die and, the conductive joint being a part of the connection and configured to carry the control information from the first die to the second die.

3. The apparatus of claim 1, wherein the control information includes only a single bit.

4. The apparatus of claim 1, wherein the first die is configured to store the first identification in the first die when the control information is transferred to the first die, and wherein the second die is configured to store the second identification in the second die when the control information is transferred to the second die.

5. The apparatus of claim 4, wherein the first die is configured to transfer the control information to the second die after the first identification is stored in the first die.

6. The apparatus of claim 1, wherein the dice include a third die, and wherein the connection is configured to transfer the control information from the second die to the third die during an assignment of a third identification to the third die.

7. The apparatus of claim 1, further comprising an additional connection coupled to the dice and extending through at least the first die, the additional connection configured to transfer the first identification to the first die and the second identification to the second die.

8. An apparatus comprising:
dice arranged in a stack, each of the dice including a logic component configured to form a portion of a connection extending through at least one of the dice to sequentially transfer control information to the dice; and
a module configured to assign identifications to the dice when the control information is transferred on the connection, wherein the connection includes a contact, a first portion coupling the contact to a first die of the dice, and a second portion coupling the first die to a second die of the dice, the contact configured to receive at least one bit of the control information, the first portion of the connection configured to transfer the at least one bit of the control information from the contact to the first die, and the second portion configured to transfer the at least one bit of the control information from the first die to the second die.

9. The apparatus of claim 8, wherein the stack includes at least one additional connection configured to transfer the identifications to the dice.

10. The apparatus of claim 8, wherein the dice include a first die, a second die, and a third die, the second die being between the first die and the third die, and wherein the logic component of each of the first die, the second, and the third die includes a substantially identical orientation with respect to an edge of the stack.

11. The apparatus of claim 8, wherein the dice include a first die, a second die, and a third die, the second die being between the first die and the third die, and wherein an orientation of the logic component of the second die with respect to an edge of the stack is different from an orientation of the logic component of the third die with respect to an edge of the stack.

12. The apparatus of claim 11, wherein the dice include a fourth die, the third die being between the second die and the fourth die, wherein an orientation of the logic component of the fourth die with respect to the edge of the stack is substantially identical to the orientation of the logic component of the second die.

13. An apparatus comprising:
a first die including a first logic component having a first input node configured to receive control information, a second input node configured to receive first enable information, and a first output node;
a second die including a second logic component having a third input node coupled to the first output node, a fourth input node configured to receive second enable information, and a second output node; and
a third die including a third logic component having a fifth input node coupled to the second output node, a sixth input node configured to receive third enable information, and a third output node, wherein the first die, the second die, and the third die are arranged in a stack.

14. The apparatus of claim 13, wherein the first logic component is configured to provide information at the first output node having a value based on a logical AND of a value of the control information and a value of the first enable information.

15. The apparatus of claim 13, wherein the first die includes a circuit configured to store a first identification in the first die when the control information has a first value and to change a value of the first enable information from a second value to the first value in order to change a value of information at the first output node from the second value to the first value.

16. The apparatus of claim 15, wherein the second die includes a circuit configured to store a second identification in the second die when the information at the first output node has the first value and to change a value of the second enable information from the second value to the first value in order to change the value of information at the second output node from the second value to the first value.

17. The apparatus of claim 16, wherein the third die includes a circuit configured to store a third identification in the third die when the information at the second output node has the first value.

18. An apparatus comprising:
a first die including a first contact, a second contact, and a logic AND gate having an input node coupled to the first contact and a first output node coupled to the second contact; and
a second die arranged in a stack with the first die, the second die including a first contact, a second contact, and a logic AND gate having an input node coupled to the first contact and a second output node coupled to the second contact; and
a conductive joint outside the first die and outside the second die, the conductive joint being coupled to the second contact of the first die and the first contact of the second die.

19. The apparatus of claim 18, wherein the first die includes a via through the first die, and wherein at least a portion of the first contact of the first die includes a conductive material contacting the via.

20. The apparatus of claim 19, wherein the second die includes a via through the second die, and wherein at least a portion of the first contact of the second die includes a conductive material contacting the via of the second die.

21. The apparatus of claim 20, wherein the second die includes an additional via through the second die, and wherein at least a portion of the second contact of the second die includes a conductive material contacting the additional via.

22. The apparatus of claim 18, wherein the stack includes a first side on one side of a center axis of the stack and a second side on another side of the center axis, the first die including a first portion on the first side of the stack and a second portion on the second side of the stack, and wherein the first contact of the first die is located on the first portion of the first die and the second contact of the first die is located on the second portion of the first die.

23. The apparatus of claim 22, wherein the second die includes a first portion on the first side of the stack and a second portion on the second side of the stack, and wherein the first contact of the second die is located on the second portion of the second die, and the second contact of the second die is located on the first portion of the second die.

24. The apparatus of claim 18, wherein a distance between a center of the first contact of the first die and an edge of the stack is substantially equal to a distance between a center of the second contact of the second die and the edge of the stack.

25. The apparatus of claim 18, wherein the first contact of the first die, the second contact of the first die, the first contact of the second die, and the second contact of the second die are substantially aligned along a line perpendicular to the stack.

26. The apparatus of claim 18, further comprising:
a third die arranged in the stack with the first die and the second die, the third die including a first contact, a second contact, and a logic AND gate having an input node coupled to the first contact and an output node coupled to the second contact; and
an additional conductive joint outside the second die and outside the third die, the additional conductive joint coupled to the second contact of the second die and the first contact of the third die.

27. A method comprising:
transferring control information to dice arranged in a stack, wherein the control information is transferred to a first die of the dice before the control information is transferred from the first die to a second die of the dice, wherein transferring the control information includes transferring at least one bit of the control information received at a contact to the first die through a first portion of the connection coupling the contact to the first die, and transferring the at least one bit of the control information from the first die to the second die through a second portion of the connection coupling the first die to the second die;
assigning a first identification to the first die when the control information is transferred to the first die; and
assigning a second identification to the second die when the control information is transferred to the second die.

28. The method of claim 27, wherein the at least one bit of the control information is transferred on a via included in the second portion of the connection coupled to the first die and the second die.

29. The method of claim 27, wherein the control information includes only a single bit.

30. The method of claim 27, wherein transferring the control information includes logically combining a value of the control information with a value of enable information at the first die to produce a result and transferring the control information from the first die to the second die based on the result.

31. The method of claim 27, wherein assigning the first and second identification includes storing the first identification in the first die and storing the second identification in the second die.

32. The method of claim 27, wherein assigning the first identification includes transferring the first identification on at least one additional connection coupled to the first die and the second die.

33. The method of claim 32, wherein assigning the second identification includes transferring the second identification on the at least one additional connection.

34. The method of claim 27, further comprising:
transferring the control information from the second die to a third die; and
assigning a third identification to the third die when the control information is transferred to the third die.

35. The method of claim 34, wherein transferring the control information from the second die to the third die includes logically combining a value of the control information with a value of enable information at the second die to produce a result, and transferring the control information from the second die to the third die based on the result.

36. A method comprising:
positioning a first die; and
arranging a second die in a stack with the first die, each of the first die and the second die including a portion of a connection used to transfer control information to the stack during an assignment of a first identification to the first die and an assignment of a second identification to the second die, wherein the connection includes a contact, the portion of the connection in the first die is coupled to the contact, the portion of the connection in the second die is coupled to the portion of connection in the first die, the contact configured to receive at least one bit of the control information, the portion of the connection in the first die configured to transfer the at least one bit of the control information from the contact to the first die, and the portion of the connection in the second die configured to transfer the at least one bit of the control information from the first die first die to the second die.

37. The method of claim 36, wherein arranging the second die includes rotating the second die about an axis before arranging the second die in the stack.

38. The method of claim 37, further comprising:
arranging a third die in the stack with the first die and the second die without rotating the third die before arranging the third die in the stack.

39. The method of claim 36, wherein arranging the second die includes flipping the second die from end to end before arranging the second die in the stack.

40. The method of claim 39, further comprising:
arranging a third die in the stack with the first die and the second die without flipping the third die before arranging the third die in the stack.

* * * * *